United States Patent
Ito et al.

(10) Patent No.: US 7,345,102 B2
(45) Date of Patent: Mar. 18, 2008

(54) EPOXY RESIN COMPOSITION FOR ENCAPSULATING OPTICAL SEMICONDUCTOR ELEMENT AND OPTICAL SEMICONDUCTOR DEVICE USING THE SAME

(75) Inventors: Hisataka Ito, Ibaraki (JP); Shinya Ota, Ibaraki (JP); Yuji Tada, Tokushima (JP)

(73) Assignee: Nitto Denko Corporation, Osaka (JP)

( * ) Notice: Subject to any disclaimer, the term of this patent is extended or adjusted under 35 U.S.C. 154(b) by 441 days.

(21) Appl. No.: 10/965,023

(22) Filed: Oct. 15, 2004

(65) Prior Publication Data

US 2005/0101709 A1    May 12, 2005

(30) Foreign Application Priority Data

Oct. 16, 2003    (JP)    ............ P. 2003-356772

(51) Int. Cl.
*C08K 5/5399* (2006.01)
*C08L 63/00* (2006.01)
*H01L 23/29* (2006.01)

(52) U.S. Cl. .............. 523/452; 257/793; 523/427; 525/481

(58) Field of Classification Search ............ None
See application file for complete search history.

(56) References Cited

U.S. PATENT DOCUMENTS

| 6,242,110 | B1 | 6/2001 | Iwasaki et al. | |
| 6,783,859 | B2 * | 8/2004 | Osada et al. | 428/413 |
| 6,797,750 | B2 * | 9/2004 | Taniguchi et al. | 523/451 |
| 6,830,825 | B2 * | 12/2004 | Sumiyoshi et al. | 428/620 |
| 6,905,768 | B2 * | 6/2005 | Tada et al. | 428/413 |
| 7,122,587 | B2 * | 10/2006 | Shimoda et al. | 523/452 |

| 2003/0187107 | A1 * | 10/2003 | Sumiyoshi et al. | 524/95 |

FOREIGN PATENT DOCUMENTS

| JP | 5-93038 A | * | 4/1993 |
| JP | 9-100337 A | | 4/1997 |
| JP | 0 915 118 A1 | | 5/1999 |
| JP | 2003-138098 A | * | 5/2003 |
| JP | 2005-8835 A | * | 1/2005 |
| WO | 02/090434 A1 | | 11/2002 |

OTHER PUBLICATIONS

Chemical abstracts registry Nos. 2734-94-3, 1109-01-9 and 15990-54-2 for phosphazine compounds, 1967, three pages.*
Patent Abstracts of Japan—2003-138098 (2003), vol. 2003, No. 9.
Patent Abstracts of Japan—2003-268208 (2003), vol. 2003, No. 12.
JP-A-2003-268208, Toshio Shiobara, "Flame Retardant Epoxy Resin Composition for Sealing of Semiconductor and Semiconductor Device".
JP-A-2003-138098, Daisuke Oka, "Epoxy Resin Composition and Semiconductor Device".

* cited by examiner

*Primary Examiner*—Robert Sellers
(74) *Attorney, Agent, or Firm*—Sughrue Mion, PLLC

(57) ABSTRACT

An epoxy resin composition for encapsulating optical semiconductor element, comprising the following (A) to (D):
  (A) an epoxy resin component comprising a novolak type epoxy resin having at least one of the biphenyl skeleton and naphthalene skeleton in one molecule in an amount of from 50 to 100% by weight of the total weight of the epoxy resin component,
  (B) a curing agent component comprising a novolak type phenol resin having at least one of the biphenyl skeleton and naphthalene skeleton in one molecule in an amount of from 50 to 100% by weight of the total weight of the curing agent component,
  (C) an organic phosphorus flame retarder, and
  (D) a curing catalyst,
  wherein the content of an organic phosphorus flame retarder as (C) is from 1.5 to 10% by weight based on the total weight of the epoxy resin composition.

6 Claims, No Drawings

EPOXY RESIN COMPOSITION FOR ENCAPSULATING OPTICAL SEMICONDUCTOR ELEMENT AND OPTICAL SEMICONDUCTOR DEVICE USING THE SAME

FIELD OF THE INVENTION

The present invention relates to an epoxy resin composition for encapsulating optical semiconductor element, which is excellent in both light transmittance and flame retardancy and an optical semiconductor device seated with the same.

BACKGROUND OF THE INVENTION

Regarding a resin composition for encapsulation which is used in encapsulating optical semiconductor elements such as light emitting diode (LED) and the like, its cured product is required to have transparence. In general, epoxy resin compositions obtained by using epoxy resins (e.g., bisphenol A epoxy resin, alicyclic epoxy resin and the like) and an acid anhydride as the curing agent are used widely for various purposes.

However, when the aforementioned epoxy resin composition is used as an encapsulating resin, it cannot meet the flame retardancy (UL-V-O) as the optical semiconductor encapsulating resin at the time of hardening of the epoxy resin composition. For example, an inorganic flame retarder is generally used in the prior art (e.g., see Reference 1), but there is a problem in that performance as an optical semiconductor device cannot fully be exerted due to considerable reduction of transmittance in case that the aforementioned inorganic flame retarder is added.

Reference 1: JP-A-9-100337

SUMMARY OF THE INVENTION

However, when flame retardancy is not added to an epoxy resin composition which is not formulated with an inorganic flame retarder because of the aforementioned problem, the encapsulating material becomes a subject of discussion in view of its ignition and exposure, so that an encapsulating material for optical semiconductor element having both of high flame retardancy and good transparency is in demand.

The present invention has been made by taking such circumstances into consideration, and an object is to provide an epoxy resin composition for encapsulating optical semiconductor element, which has high flame retardancy and keeps high transmittance and an optical semiconductor device using the same.

With the aim of achieving the aforementioned object, a first gist of the present invention resides in an epoxy resin composition for encapsulating optical semiconductor element, comprising the following (A) to (D):

(A) an epoxy resin component comprising a novolak type epoxy resin having at least one of the biphenyl skeleton and naphthalene skeleton in one molecule in an amount of from 50 to 100% by weight of the total weight of the epoxy resin component, (B) a curing agent component comprising a novolak type phenol resin having at least one of the biphenyl skeleton and naphthalene skeleton in one molecule in an amount of from 50 to 100% by weight of the total weight of the curing agent component, (C) an organic phosphorus flame retarder, and (D) a curing catalyst, wherein the content of an organic phosphorus flame retarder as (C) is from 1.5 to 10% by weight based on the total weight of the epoxy resin composition.

Also, a second gist of the present invention resides in an optical semiconductor device prepared by encapsulating an optical semiconductor element using the aforementioned epoxy resin composition for encapsulating optical semiconductor element.

That is, the present inventors have conducted intensive studies for the purpose of obtaining a material for encapsulating optical semiconductor element, which can provide excellent flame retardancy without causing reduction of transmittance. As a result, it was found that, when the aforementioned epoxy resin and phenol resin having specified structures are jointly used and an organic phosphorus flame retarder is used at a specified ratio instead of an inorganic flame retarder, a cured product prepared by using the aforementioned epoxy resin and phenol resin having specified structures shows high decomposition energy and also generates a foaming structure to form a foaming layer having adiabatic effect against exposure, so that excellent flame retardancy is exerted and good transparency is provided, thus resulting in the accomplishment of the present invention.

As described in the above, the present invention is an epoxy resin composition for encapsulating optical semiconductor element, which uses the aforementioned specified epoxy resin component (A) and specified curing agent component (B) and also contains an organic phosphorus flame retarder (C) at a specified ratio. Thus, good transparency is ensured and excellent flame retardancy is obtained.

In addition, when a specified cyclic phosphazene compound is used as the aforementioned organic phosphorus flame retarder (C), still more improvement of heat resistance is realized.

DETAILED DESCRIPTION OF THE INVENTION

The epoxy resin composition for encapsulating optical semiconductor element of the present invention is obtained by using a specified epoxy resin component (A), a specified curing agent component (B), an organic phosphorus flame retarder (C) and a curing catalyst (D).

In the aforementioned specified epoxy resin component (A), a characteristic epoxy resin having at least one of the biphenyl skeleton and naphthalene skeleton in one molecule occupies from 50 to 100% by weight of the entire epoxy resin component. More preferred is a case in which the aforementioned characteristic epoxy resin occupies 80% by weight or more of the total weight of the epoxy resin component. Particularly preferred is a case in which the aforementioned characteristic epoxy resin occupies the entire epoxy resin component. That is, this is because effective flame retardancy may not be brought out when ratio of the aforementioned characteristic epoxy resin based on the total weight of the epoxy resin component is less than 50% by weight.

As the aforementioned characteristic epoxy resin, an epoxy resin represented by the following general formula (1-1) and an epoxy resin represented by the following general formula (1-2) can be illustratively exemplified. These can be used alone or as a mixture of two or more.

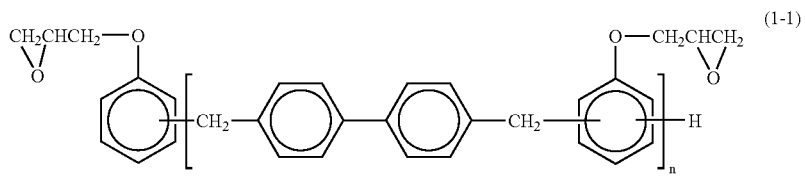

(In the above formula (1-1), n is an integer of from 1 to 10.)

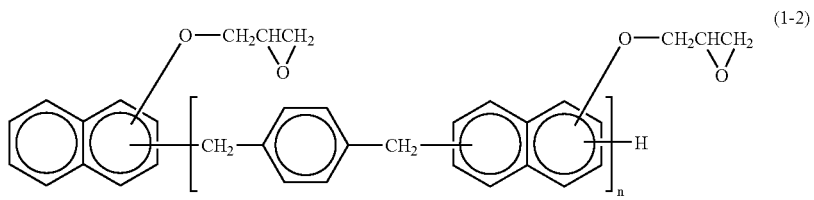

(In the above formula (1-2), n is an integer of from 1 to 10.)

Examples of the aforementioned epoxy resin represented by the general formula (1-1) include NC-3000 manufactured by Nippon Kayaku, and the like.

Also, examples of the aforementioned epoxy resin represented by the general formula (1-2) include ESN-100 series manufactured by Nippon Steel Kagaku, and the like.

In addition, regarding the epoxy resin which can be used jointly with the aforementioned characteristic epoxy resin, various epoxy resins of bifunctional or more can be used from the viewpoint of transparency at the time of hardening, with the proviso that coloring is of no importance. Examples thereof include bisphenol A-type epoxy resins and the like.

The specified curing agent component (B) to be used together with the aforementioned epoxy resin component (A) is a substance which acts as a curing agent of the aforementioned epoxy resin as a matter of course, and a characteristic phenol resin having at least one of the biphenyl skeleton and naphthalene skeleton in one molecule occupies from 50 to 100% by weight of the total weight of the curing agent component. More preferred is a case in which the aforementioned characteristic phenol resin occupies 80% by weight or more of the total weight of the curing agent component, and particularly preferred is a case in which the aforementioned characteristic phenol resin occupies the entire curing agent component. That is, this is because effective flame retardancy may not be brought out when ratio of the aforementioned characteristic phenol resin based on the total weight of the curing agent component is less than 50% by weight.

As the aforementioned characteristic phenol resin, a phenol resin represented by the following general formula (2-1) and a phenol resin represented by the following general formula (2-2) can be illustratively exemplified. These can be used alone or as a mixture of two or more.

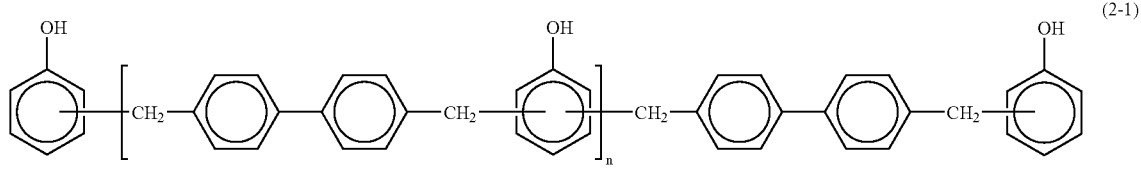

(In the above formula (2-1), n is an integer of from 1 to 10.)

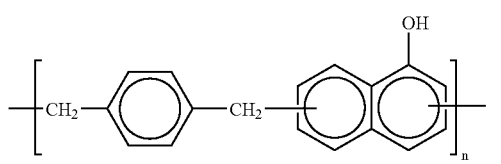

(In the above formula (2-2), n is an integer of from 1 to 10.)

Examples of the aforementioned phenol resin represented by the general formula (2-1) include MEH-7851 manufactured by Meiwa Kasei, and the like.

Also, examples of the aforementioned phenol resin having a repeating unit represented by the general formula (2-2) include SN-400 series manufactured by Nippon Steel Kagaku, and the like.

Regarding the curing agent which can be used jointly with the aforementioned characteristic phenol resin, various phenol resins of bifunctional or more can be used from the viewpoint of transparency at the time of hardening, with the proviso that coloring is of no importance. Also, a conventional acid anhydride curing agent may be jointly used.

In addition, it is desirable that the equivalent ratio of the number of epoxy functional groups derived from the aforementioned epoxy resin component (A) to phenolic functional groups derived from the aforementioned curing agent component (B) is set to preferably from 0.7:1 to 1.5:1, more preferably from 0.8:1 to 1.3:1, particularly preferably from 0.9:1 to 1.2:1. That is, this is because a tendency of causing considerable coloring of the cured product is found when the aforementioned equivalent ratio is less than 0.7:1, and a tendency of markedly reducing the reactivity is found when it exceeds 1.5:1.

Regarding the organic phosphorus flame retarder (C) to be used together with the aforementioned epoxy resin component (A) and curing agent component (B), a substance which has good compatibility with the aforementioned epoxy resin component (A) and curing agent component (B) and does not spoil transparency is used. As such a organic phosphorus flame retarder (C), it is desirable to use a compound having a phosphazene structure therein, and a cyclic phosphazene compound represented by the following general formula (3) is particularly desirably used.

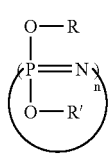

(3)

(In the above formula (3), R and R' are monovalent organic groups, and n is from 3 to 7.)

In the above formula (3), the repeating number n is an integer of from 3 to 7 by taking increase of viscosity into consideration, and it is effective that it has a trimerized 6-membered ring structure. Also, for the purpose of improving flame retardancy, a compound in which a part of the R of the cyclic phosphazene compound having a repeating unit represented by the aforementioned formula (3) has a bridged structure with other cyclic phosphazene compound is used. In addition, it is desirable that the R is phenyl group from the viewpoint of heat resistance. As such a cyclic phosphazene compound, illustratively a cyclic phosphazene compound represented by the following structural formula (3-1) and a cyclic phosphazene compound represented by the following structural formula (3-2) are particularly preferably used.

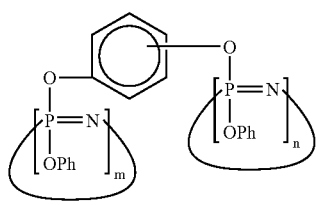

(3-1)

(In the formula (3-1), Ph is phenyl group, and each of m and n is an integer of from 3 to 7.)

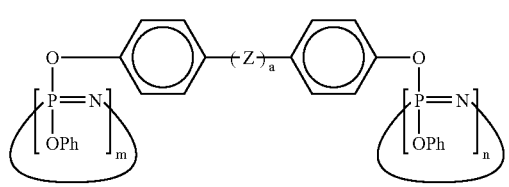

(3-2)

(In the formula (3-2), Ph is phenyl group, each of m and n is an integer of from 3 to 7, Z is —C(CH$_3$)$_2$—, —SO$_2$—, —S— or —O—, and a is 0 or 1.)

As the cyclic phosphazene compound represented by the aforementioned structural formula (3-2), SPE-100 manufactured by Otsuka Kagaku, and the like, can for example be cited.

It is necessary that the containing amount of the aforementioned organic phosphorus flame retarder (C) be set to a range of from 1.5 to 10% by weight based on the total weight of the epoxy resin composition, from the viewpoint of ensuring flame retardancy. From the viewpoint of ensuring thermal time hardness of the cured product, the range of from 2 to 8% by weight is more preferable.

The curing catalyst (D) to be used together with the aforementioned epoxy resin component (A), curing agent component (B) and organic phosphorus flame retarder (C) is not particularly limited Examples thereof include 1,8-diazabicyclo(5,4,0)undecene-7, triethylenediamine, tri-2,4,6-dimethylaminomethylphenol and the like tertiary amines, 2-ethyl-4-methylimidazole, 2-methylimidazole and the like imidazoles, triphenylphosphine, tetraphenylphosphonium tetraphenylborate, tetra-n-butylphosphonium-o,o-diethylphosphoro dithioate and the like phosphorus compounds, quaternary ammonium salts, organic metal salts and derivatives thereof. These can be used alone or as a mixture of two or more. Among these curing catalysts, it is desirable to use tertiary amines, imidazoles and phosphorus compounds. Further among them, it is particularly desirable to use phosphorus compounds or imidazoles for the purpose of obtaining a transparent and tough cured product.

It is desirable to set the containing amount of the aforementioned curing catalyst (D) preferably within the range of from 0.01 to 8 parts by weight (to be referred to as "part(s)" hereinafter) based on 100 parts of the aforementioned epoxy resin component (A), more preferably from 0.1 to 3.0 parts. That is, this is because sufficient hardening accelerating effect may hardly be obtained when it is less than 0.01 part, and discoloration may be found sometimes on the obtained cured product when it exceeds 8 parts.

In this connection, the epoxy resin composition for encapsulating optical semiconductor element of the present invention may be optionally blended with other additives as occasion demands, in addition to the aforementioned A to D.

As the aforementioned other additives, for example, a coupling agent is used. Examples of the aforementioned coupling agent include conventional various coupling agents such as a silane coupling agent, a titanate coupling agent and the like.

In addition, a degradation preventing agent, a denaturant, a defoaming agent and the like are used as the aforementioned other additives.

Examples of the aforementioned degradation preventing agent include conventional various degradation preventing agents such as a phenol compound, an amine compound, an organic sulfur compound, a phosphine compound and the like.

Examples of the aforementioned denaturant include conventional various denaturants such as glycols, silicones, alcohols and the like.

Examples of the aforementioned defoaming agent include conventional various defoaming agents such as a silicone system and the like.

In addition, the epoxy resin composition for encapsulating optical semiconductor element of the present invention can be obtained in the form of a liquid, a powder or a tablet made from the powder, by producing it in the following manner.

That is, in order to obtain a liquid epoxy resin composition for encapsulating optical semiconductor element, for example, the aforementioned respective components, namely an epoxy resin component, a curing agent component, an organic phosphorus flame retarder, a curing catalyst and additives which are blended as occasion demands, may be optionally formulated. In addition, when it is obtained in the form of a powder or a tablet made from the powder, for example, the aforementioned respective components are optionally formulated to carry out preliminary mixing and kneaded using a kneader to carry out melt mixing, and then this is cooled down to room temperature and pulverized by a conventional means, if necessary further carrying out tablet making.

The epoxy resin composition for encapsulating optical semiconductor element of the present invention obtained in this manner is used for the encapsulation of optical semiconductor elements such as LED, charge coupled device (CCD) and the like. That is, encapsulation of an optical semiconductor element using the epoxy resin composition for encapsulating optical semiconductor element of the present invention can be varied out by employing a conventional molding method such as a transfer molding, cast molding or the like without particular limitation. When the epoxy resin composition for encapsulating optical semiconductor element of the present invention is in the form of a powder or tablet, it may be made into a B-stage (semi-cured state) at the time of melt-mixing the aforementioned respective components, and this is heat-melted when used.

Next, Examples are described together with Comparative Examples.

Respective components shown below were prepared prior to the Examples.

Epoxy Resin a:
An epoxy resin represented by the following structural formula (a) (epoxy equivalent 274)

Epoxy Resin b:
An epoxy resin represented by the following structural formula (b) (epoxy equivalent 275)

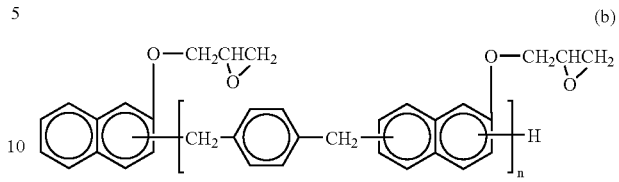

Epoxy Resin c:
A bisphenol A type epoxy resin (epoxy equivalent 475)

Curing Agent a:
A phenol resin represented by the following structural formula (d) (hydroxyl group equivalent 203)

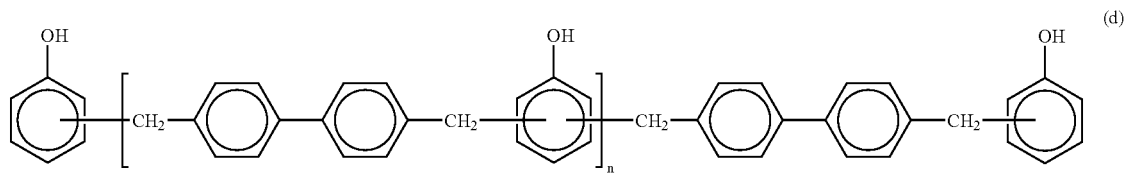

Curing Agent b:
A phenol resin having a repeating unit represented by the following structural formula (e) (hydroxyl group equivalent 210)

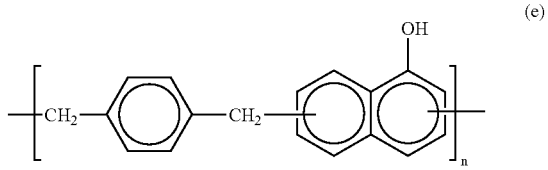

Curing Agent c:
A mixture of 4-methylhexahydrophthalic anhydride (x) and hexahydrophthalic anhydride (y) (mixing weight ratio x:y=7:3)

Organic Phosphorus Flame Retarder:
A cyclic phosphazene compound having a crosslinking structure (SPE-100, mfd. by Otsuka Kagaku)

Coupling Agent:
A mercapto-containing silane coupling agent (KBM-803, mfd. by Shin-Etsu Chemical)

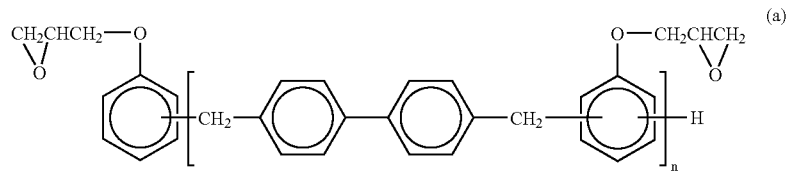

Curing Catalyst:
2-Ethyl-4-methylimidazole

EXAMPLES 1 TO 10 AND COMPARATIVE EXAMPLES 1 to 7

The respective components shown in Table 1 and Table 2 were formulated at the ratios shown in the same tables, melt-kneaded at 110° C., cooled to effect solidification and then pulverized and made into tablets, thereby preparing the epoxy resin compositions of interest.

Using respective epoxy resin compositions obtained in this manner, their flame retardancy, transmittance and thermal time hardness were measured and evaluated in accordance with the following respective methods. The results are shown in Table 3 and Table 4, which are described later.

Flame Retardancy:

A test piece for flame retardancy having a thickness of 3.175 mm was molded using each epoxy resin composition (molding condition: 150° C.×5 min+150° C.×3 hours), and its flame retardancy was evaluated in accordance with the method of UL-94 standard. In this case, "accepted" means acceptance of UL-94V-0.

Transmittance:

A cured product having a thickness of 1 mm was prepared using each epoxy resin composition (curing condition: 150° C.×5 min+150° C.×3 hours). Using the aforementioned cured product, its light transmittance at a wavelength of 589.3 nm was measured using a spectrophotometer UV3101 manufactured by Shimadzu Corp.

Thermal Time Hardness:

A test piece of 10 mm×64 mm×4 mm in thickness was prepared using each epoxy resin composition under a molding condition of 150° C.×5 min, and hardness on the test piece surface just after the preparation was measured using a Shore A hardness meter (mfd. by Kamishima Seisakusho).

TABLE 1

| | | Examples | | | | | | | | | |
|---|---|---|---|---|---|---|---|---|---|---|---|
| | | 1 | 2 | 3 | 4 | 5 | 6 | 7 | 8 | 9 | 10 |
| Epoxy resin | a | 100 | 100 | 100 | — | — | 100 | 50 | 155 | 50 | 100 |
| | b | — | — | — | 100 | 100 | — | — | — | 50 | — |
| | c | — | — | — | — | — | — | 50 | — | — | — |
| Curing agent | a | 74 | 74 | 74 | 74 | — | — | 130 | 50 | 59 | 37 |
| | b | — | — | — | — | 78 | 72 | — | — | — | 37 |
| | c | — | — | — | — | — | — | — | 50 | — | — |
| Organic phosphorus flame retarder | | 3.6 | 2.7 | 19.6 | 3.6 | 3.7 | 3.5 | 4.7 | 5.2 | 3.3 | 3.6 |
| Coupling agent | | 1 | 1 | 1 | 1 | 1 | 1 | 1 | 1 | 1 | 1 |
| Curing catalyst | | 1 | 1 | 1 | 1 | 1 | 1 | 1 | 1 | 1 | 1 |
| Organic phosphorus flame retarder content (wt %) | | 2.0 | 1.5 | 10.0 | 2.0 | 2.0 | 2.0 | 2.0 | 2.0 | 2.0 | 2.0 |

TABLE 2

| | | Comparative Examples | | | | | | |
|---|---|---|---|---|---|---|---|---|
| | | 1 | 2 | 3 | 4 | 5 | 6 | 7 |
| Epoxy resin | a | 100 | — | — | 100 | 100 | 40 | 93 |
| | b | — | — | — | — | — | — | — |
| | c | — | 50 | 100 | — | — | 60 | — |
| Curing agent | a | — | 100 | — | 74 | 74 | 55 | 30 |
| | b | — | — | — | — | — | — | — |
| | c | 60 | — | 150 | — | — | — | 40 |
| Organic phosphorus flame retarder | | 18 | 16.9 | 28 | 1.8 | 24 | 3.2 | 3.7 |
| Coupling agent | | 1 | 1 | 1 | 1 | 1 | 1 | 1 |
| Curing catalyst | | 1 | 1 | 1 | 1 | 1 | 1 | 1 |
| Organic phosphorus flame retarder content (wt %) | | 10.0 | 10.0 | 10.0 | 1.0 | 12.0 | 2.0 | 2.0 |

TABLE 3

| | Examples | | | | | | | | | |
|---|---|---|---|---|---|---|---|---|---|---|
| | 1 | 2 | 3 | 4 | 5 | 6 | 7 | 8 | 9 | 10 |
| Flame retardancy (UL-94V) | V-0 pass | V-0 pass | V-0 pass | V-0 pass | V-0 pass | V-0 pass | V-0 pass | V-0 pass | V-0 pass | V-0 pass |
| Transmittance (%) (598.3 nm) | 70 | 72 | 70 | 65 | 69 | 70 | 66 | 69 | 71 | 70 |
| Thermal time hardness | 79 | 79 | 77 | 80 | 78 | 78 | 75 | 77 | 77 | 78 |

Note:
"pass" means accepted

TABLE 4

| | Examples | | | | | | |
|---|---|---|---|---|---|---|---|
| | 1 | 2 | 3 | 4 | 5 | 6 | 7 |
| Flame retardancy (UL-94V) | rejected | rejected | rejected | V-1* pass | V-0 pass | V-1* pass | V-1* pass |
| Transmittance (%) (598.3 nm) | 70 | 70 | 70 | 70 | 70 | 72 | 74 |
| Thermal time hardness | 79 | 79 | 77 | 80 | 70 | 76 | 77 |

Note,
"pass": accepted
*passed the V-1 standard but did not reach the V-0 standard Based on the above results, all products of the Examples were V-0 acceptance by the UL-94 standard, and there were no particularly problematic values regarding their transmittance. In addition, all of their thermal time hardness values were 75 or more.

Contrary to this, all of the product of Comparative Example 1 which used a mixture of 4-methylhexahydrophthalic anhydride and hexahydrophthalic anhydride as the curing agent, the product of Comparative Example 2 which used a bisphenol A type epoxy resin as the epoxy resin and the product of Comparative Example 3 which used a mixture of 4-methylhexahydrophthalic anhydride and hexahydrophthalic anhydride as the curing agent were rejected, because they did not satisfy the UL-94V standard regarding flame retardancy in spite of the use of a cyclic phosphazene compound as the organic phosphorus flame retarder. In addition, the product of Comparative Example 4 having an organic phosphorus flame retarder content of 1.0% by weight realized V-1 standard of the UL-94V standard, but could not realize the V-0 standard. On the other hand, the product of Comparative Example 5 having an organic phosphorus flame retarder content of 12% by weight showed almost the same values of the characteristics of the products of Examples regarding the flame retardancy and transmittance, but its thermal time hardness was low, showing that it caused reduction of hardness of the cured resin product. Also, the product of Comparative Example 6 in which the epoxy resin a content was less that 50% by weight of the total weight of the epoxy resin component was unable to realize V-0 standard of the UL-94V standard. In addition, the product of Comparative Example 7 in which the curing agent a content was less that 50% by weight of the total weight of the curing agent component was also unable to realize V-0 standard of the UL-94V standard.

While the invention has been described in detail and with reference to specific embodiments thereof, it will be apparent to one skilled in the art that various changes and modifications can be made therein without departing from the scope thereof.

This application is based on Japanese patent application No. 2003-356772 filed Oct. 16, 2003, the entire contents thereof being hereby incorporated by reference.

What is claimed is:

1. An epoxy resin composition for encapsulating optical semiconductor element, consisting essentially of the following (A) to (D):
    (A) an epoxy resin component comprising a novolak epoxy resin having at least one of the biphenyl skeleton and naphthalene skeleton in one molecule in an amount of from 50 to 100% by weight of the total weight of the epoxy resin component,
    (B) a curing agent component comprising a novolak phenol resin having at least one of the biphenyl skeleton and naphthalene skeleton in one molecule in an amount of from 50 to 100% by weight of the total weight of the curing agent component,
    (C) an organic phosphorus flame retarder, and
    (D) a curing catalyst,
    wherein the content of an organic phosphorus flame retarder as (C) is from 1.5 to 10% by weight based on the total weight of the epoxy resin composition.

2. The epoxy resin composition for encapsulating optical semiconductor element according to claim 1, wherein equivalent ratio of the number of epoxy functional groups derived from the epoxy resin component (A) to phenolic functional groups derived from the curing agent component (B) is from 0.7:1 to 1.5:1.

3. The epoxy resin composition for encapsulating optical semiconductor element according to claim 1, wherein the aforementioned novolak type epoxy resin having at least one of the biphenyl skeleton and naphthalene skeleton in one molecule is at least one of an epoxy resin represented by the following general formula (1-1) and an epoxy resin represented by the following general formula (1-2):

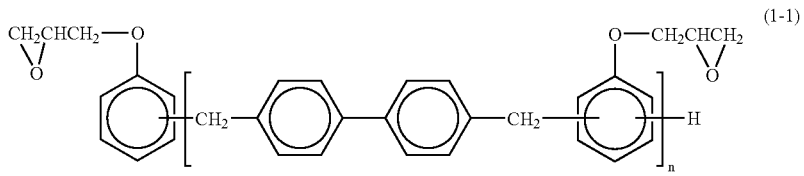

(in the above formula (1-1), n is an integer of from 1 to 10)

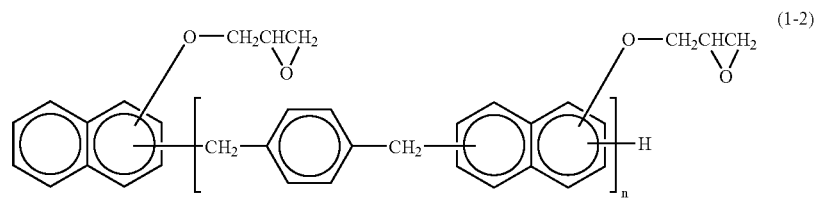

(in the above formula (1-2), n is an integer of from 1 to 10).

4. The epoxy resin composition for encapsulating optical semiconductor element according to claim 1, wherein the aforementioned novolak type phenol resin having at least one of the biphenyl skeleton and naphthalene skeleton in one molecule is at least one of a phenol resin represented by the following general formula (2-1) and a phenol resin having a repeating unit represented by the following general formula (2-2):

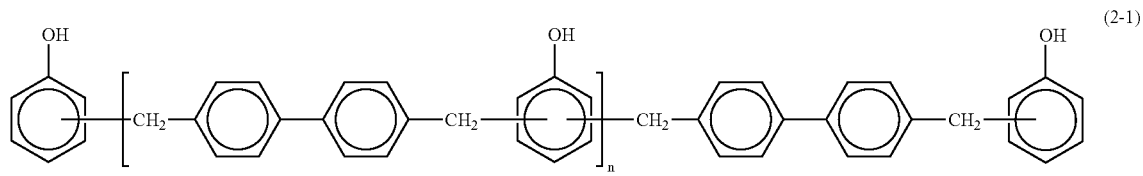
(2-1)

(in the above formula (2-1), n is an integer of from 1 to 10)

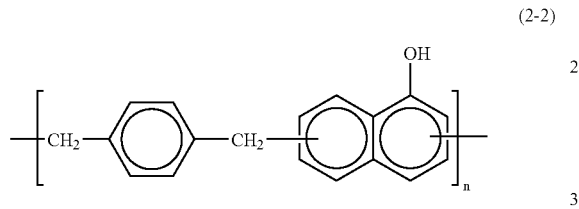
(2-2)

(in the above formula (2-2), n is an integer of from 1 to 10).

5. The epoxy resin composition for encapsulating optical semiconductor element according to claim 1, wherein the aforementioned organic phosphorus flame retarder (C) is a cyclic phosphazene compound represented by the following general formula (3)

(3)

(in the above formula (3), R and R' are monovalent organic groups, and n is from 3 to 7).

6. An optical semiconductor device which comprises an optical semiconductor element and the epoxy resin composition for encapsulating optical semiconductor element described in any one of claims 1 to 5 which seals said element.

* * * * *